United States Patent [19]
Lee

[11] Patent Number: 5,851,708
[45] Date of Patent: Dec. 22, 1998

[54] METHOD FOR FABRICATING PHASE SHIFTING MASK AND A PHASE SHIFTING MASK

[75] Inventor: Jun Seok Lee, Seoul, Rep. of Korea

[73] Assignee: LG Semicon Co., Ltd., Cheongju-si, Rep. of Korea

[21] Appl. No.: 856,194

[22] Filed: May 14, 1997

[30] Foreign Application Priority Data

Jun. 26, 1996 [KR] Rep. of Korea ............ 24096/1996

[51] Int. Cl.[6] .................................................. G03F 9/00
[52] U.S. Cl. ............................................................ 430/5
[58] Field of Search .............................. 430/5, 322, 323, 430/324

[56] References Cited

U.S. PATENT DOCUMENTS

| 5,244,759 | 9/1993 | Pierrat | 430/5 |
| 5,536,606 | 7/1996 | Doan | 430/5 |

OTHER PUBLICATIONS chou et al.; "Simulation and Fabrication of a New Phase Shifting Mask for 0.35 um contact hole pattern transfer : Halftone–Rim"; SPIE vol. 2087; pp. 380, May 1993.

"0.3–micron optical lithography using a phase–shifting mask," Terasawa et al., SPIE, vol. 1088, Optical/Laser Microlithography (1989), pp. 25–33.

"Improving Resolution in Photolithography with a Phase–Shifting Mask," Levenson et al., IEEE, vol. Ed–29, No. 12, Dec. 1982, pp. 1828–1836.

"New Phase Shifting Mask with Self–aligned Phase Shifters for a Quarter Micron Photolithography," Nitayama et al., IEDM, 1989, pp. 57–60, 3.3.1–3.3.4.

*Primary Examiner*—S. Rosasco

[57] ABSTRACT

The method for fabricating a phase-shifting mask includes the steps of providing a substrate having a light shielding layer and a phase-shifting light transmitting layer sequentially formed thereon, first patterning the light shielding layer and the phase-shifting light-transmitting layer to form phase-shifting regions, and oxidizing sidewall portions of the light shielding layer in each phase-shifting region to form phase-shifting light-transmitting sidewall portions. The method further includes the steps of depositing photoresist over the substrate, second patterning the photoresist using the light shielding layer as a mask such that in each phase-shifting region a portion of the phase-shifting light-transmitting layer on the light shielding layer is exposed by removal of the photoresist, and forming a rim phase-shifting layer in each phase-shifting region using the photoresist pattern as a mask. The rim phase-shifting layer includes unexposed portions of the phase-shifting light-transmitting layer and the phase-shifting light transmitting sidewall portions. Then, a half-tone layer in each phase-shifting region is formed using the photoresist pattern as a mask such that a rim phase-shifting layer surrounds each half-tone layer.

26 Claims, 8 Drawing Sheets

METHOD FOR FABRICATING PHASE SHIFTING MASK AND A PHASE SHIFTING MASK

BACKGROUND OF THE INVENTION

1. Field of the Invention

The present invention relates to a semiconductor mask, and more particularly, to a method for fabricating a phase shifting mask.

2. Discussion of the Related Art

Generally, in the photolithography techniques used to manufacture a semiconductor device, a photomask is widely used. The photomask includes a light-transmitting portion and a light-shielding portion forming a light-transmitting pattern and a light-shielding pattern to perform selective exposure of a surface upon which the photomask is disposed. As device integration increases, so does the required pattern density. Light diffraction, however, places limits on the resolution of patterns created using photomasks.

In order to avoid this problem, a variety of phase shifting masks have been developed, Phase-shifting masks create a phase difference in the exposure light. As a result, greater pattern resolution has been achieved.

For example, in a phase shifting mask, a phase of incident light from a phase modulated light-transmitting layer is shifted by 180°. The phase shifted incident light interferes with incident light from a common light-transmitting layer. As a result of the interference, the resulting exposure pattern has a higher resolution as compared to patterns generated using a common mask. Accordingly, phase-shifting masks have higher resolution and better focus depth than common masks.

Since the alternate type phase shifting mask proposed by Levenson, a rim type phase shifting mask for improving the resolution of a contact hole has been published in the International Electron Device Meeting (IEDM) Technical digest by Nitayama et al., and an outrigger type phase shifting mask has been published by Terasawa of Hitachi. Thus, the utility of such masks appears to be increasing. In addition, a reduction type phase shifting mask (or half-tone phase shifting mask) capable of higher aerial image intensity and edge sharpness has been developed.

A conventional phase shifting mask will now be described with reference to the appended drawings. FIGS. 1a to 1d show sectional views of the process steps to form a conventional phase shifting mask. FIGS. 2a to 2d show sectional views of the process steps to form another conventional phase shifting mask.

First, the process steps for fabricating the rim type phase shifting mask will be described below with reference to FIGS. 1a to 1d. In the rim type phase shifting mask, a light-shielding pattern is wet-etched to ensure an undercut margin of a rim phase-shifting layer.

As shown in FIG. 1a, a light-shielding layer and a photoresist layer 2 are sequentially formed on a transparent substrate 1. Then, the photoresist layer 2 is patterned and the light-shielding layer is selectively etched, using the photoresist layer 2 as a mask, to form a light-shielding pattern layer 3.

Subsequently, the photoresist layer 2 is removed and a phase-shifting light-transmitting layer 4 is formed by depositing a polymethyl meth acrylate 4 (PMMA) over an entire surface of the substrate 1 as shown in FIG. 1b. Then, the phase shifting light-transmitting layer 4 is exposed from the opposite side of the transparent substrate 1 to form a phase-shifting pattern layer 5 using the light-shielding pattern layer 3 as a mask as shown in FIG. 1c.

As shown in FIG. 1d, the light-shielding pattern layer 3 is wet-etched to form a light-shielding pattern layer 6 which is undercut to expose a rim portion of the phase-shifting pattern layer 5. As shown in FIG. 1d, the thickness d of the phase-shifting pattern layer 5 is set to equal $\lambda/2(n-1)$; where $\lambda$ is a wavelength of an exposure source and n is the refraction index of the phase-shifting pattern layer 5.

The other conventional phase shifting mask, which is manufactured by replacing the light-shielding layer of the rim type phase shifting mask with a half transparent layer, will now be described. As shown in FIG. 2a, a half transparent chrome layer is deposited on a transparent substrate 1 to form a half transparent layer 7.

A transparent phase-shifting light-transmitting layer 4 is formed on the half transparent layer 7. Then, a positive photoresist is deposited on the phase-shifting light-transmitting layer 4, and an electron beam is selectively scanned on the positive photoresist to form a positive photoresist pattern layer 8.

Subsequently, the exposed portions of the phase-shifting light-transmitting layer 4 are removed by dry etching using the positive photoresist pattern layer 8 as a mask, as shown in FIG. 2b.

As shown in FIG. 2c, the half transparent layer 7 is wet-etched using the positive photoresist pattern 8 and the phase-shifting light-transmitting layer 4 as a mask, to form a half transparent shifted layer 9.

As shown in FIG. 2d, the positive photoresist pattern layer is removed to complete the formation of a phase shifting mask.

As aforementioned, the exposed portions of the phase-shifting light transmitting layer of the conventional phase-shifting masks phase shift incident light by 180° to interfere with incident light passing through the substrate 1 but not the exposed portions of the phase-shifting light-transmitting layer. As a result of the interference, the phase shifting mask has a higher resolution and focus depth than a common mask.

However, the conventional phase shifting mask has several problems. First, it is hard to adjust the thickness and width of the exposed portions of the phase-shifting light-transmitting layer due to the undercut phenomenon caused by wet-etching the light-shielding layer because the low adhesion between the phase-shifting light-transmitting layer and the light-shielding layer or half transparent layer. Third, it is hard to obtain a uniform phase shifting mask because of damage to the substrate caused by the etching processes.

Finally, it is likely that the edge effect of the rim shifted phase-shifting layer can be reduced by using a sensitive organic material as the phase-shifting light-transmitting layer.

SUMMARY OF THE INVENTION

Accordingly, the present invention is directed to a phase shifting mask and a method of fabricating a phase shifting mask that substantially obviates one or more of the problems due to limitations and disadvantages of the related art.

An object of the present invention is to provide a phase shifting mask and a method of fabricating a phase shifting mask in which the edge effect of a rim phase-shifting portion is enhanced.

To achieve these and other advantages and in accordance with the purpose of the present invention, as embodied and broadly described, the method for fabricating a phase shifting mask according to the present invention includes the steps of providing a substrate having a light shielding layer and a phase-shifting light transmitting layer sequentially formed thereon; first patterning said light shielding layer and said phase-shifting light-transmitting layer to form phase-shifting regions; oxidizing sidewall portions of said light shielding layer in each phase-shifting region to form phase-shifting light-transmitting sidewall portions; depositing photoresist over said substrate; second patterning said photoresist using said light shielding layer as a mask such that in each phase-shifting region a portion of said phase-shifting light-transmitting layer on said light shielding layer is exposed by removal of said photoresist; forming a rim phase-shifting layer in each phase-shifting region using said photoresist pattern as a mask, said rim phase-shifting layer including unexposed portions of said light shielding layer and said phase-shifting light transmitting sidewall portions; and forming a half-tone layer in each phase-shifting region using said photoresist pattern as a mask such that a rim phase-shifting layer is adjacent each side of said half-tone layer.

These and other objects are also achieved by providing a phase-shifting mask, comprising: a substrate; a plurality half-tone layer portions formed on said substrate; a rim phase-shifting portion formed on said substrate surrounding each half-tone layer portion.

It is to be understood that both the foregoing general description and the following detailed description are exemplary and explanatory and are intended to provide further explanation of the invention as claimed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENT

Reference will now be made in detail to the preferred embodiments of the present invention, examples of which are illustrated in the accompanying drawings.

A phase shifting mask according to the present invention is formed by enhancing the edge effect of a rim phase-shifting portion at the time of exposure of a wafer and performing self-alignment of the rim phase-shifting portion at both sides of a light-shielding pattern layer or half transparent layer.

Figure 1A:
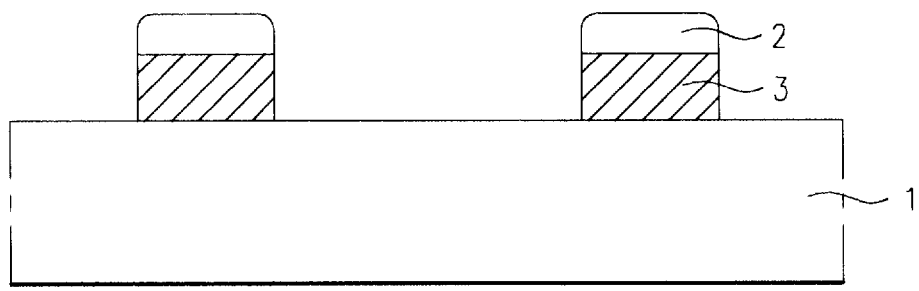
FIGS. 1a to 1d show sectional views of the process steps to form a conventional phase shifting mask.
Figure 1B:
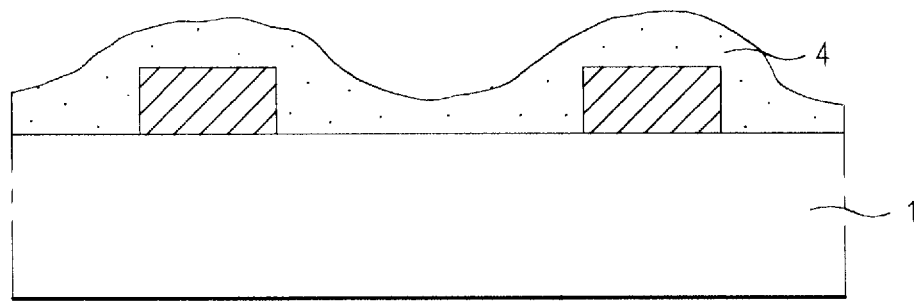
Figure 1C:
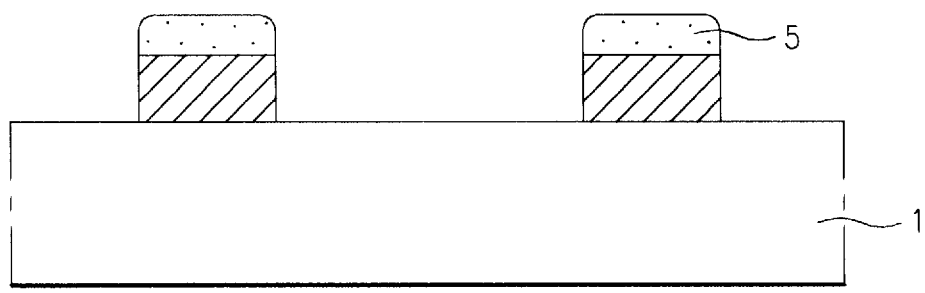
Figure 1D:
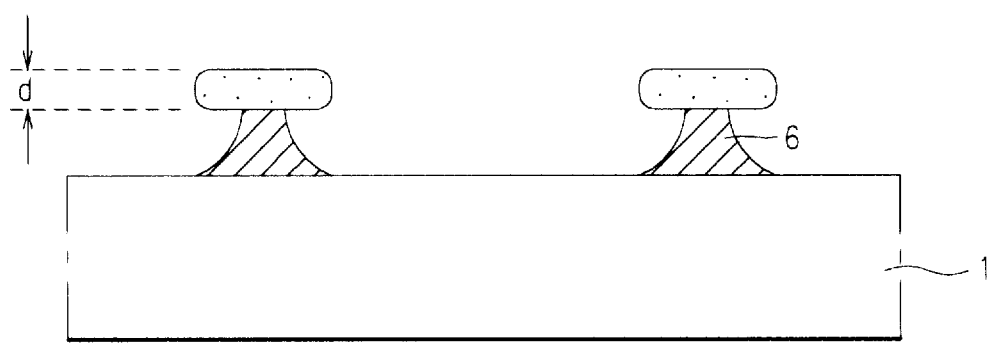
Figure 2A:
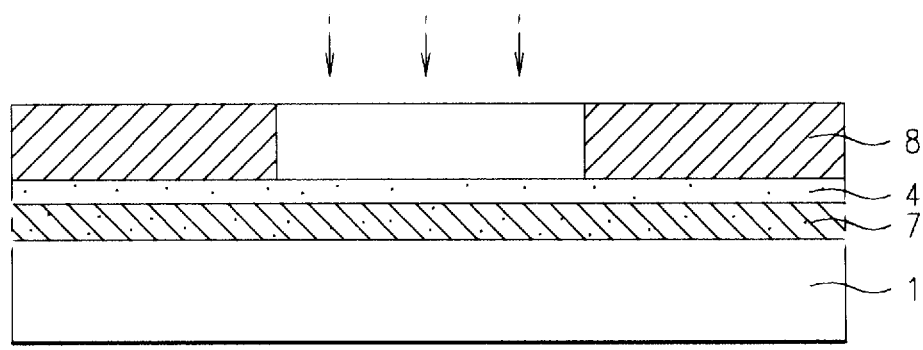
FIGS. 2a to 2d show sectional views of the process steps to form another conventional phase shifting mask.
Figure 2B:
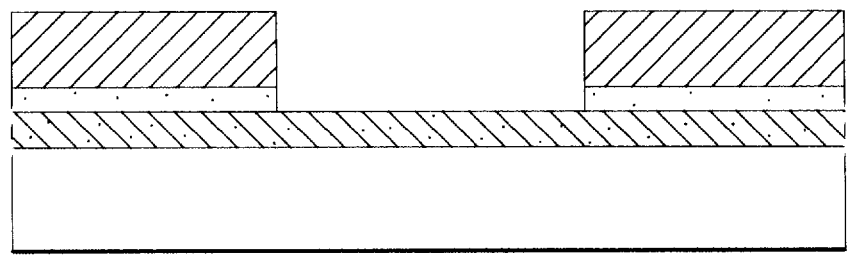
Figure 2C:
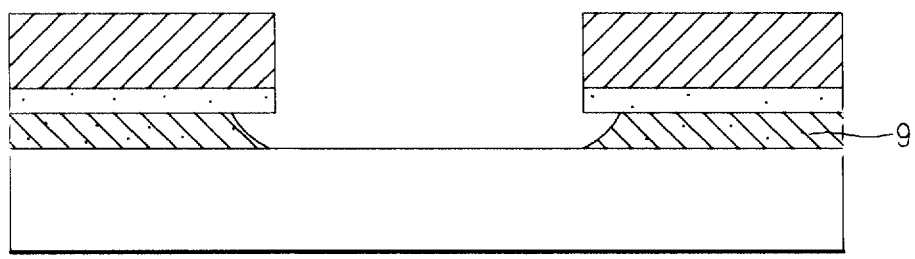
Figure 2D:
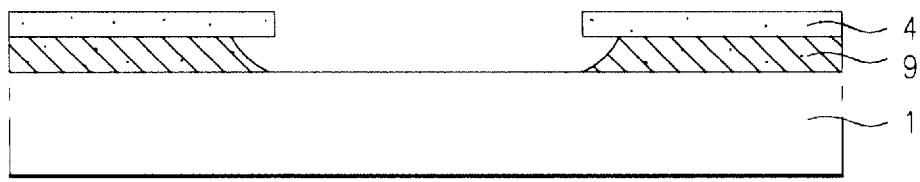
Figure 3A:
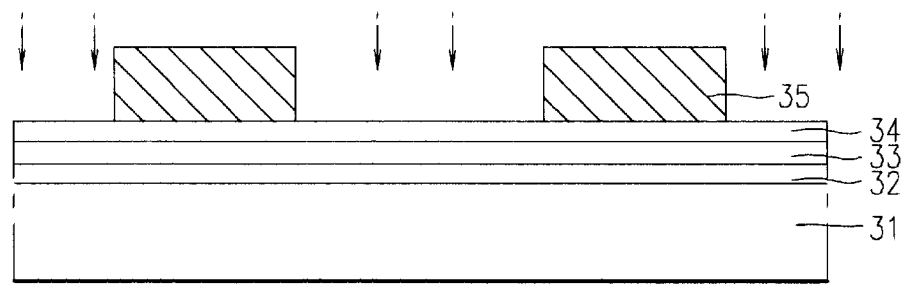
FIGS. 3a to 3h show sectional views of the process steps to form a phase shifting mask according to the present invention.
Figure 3B:
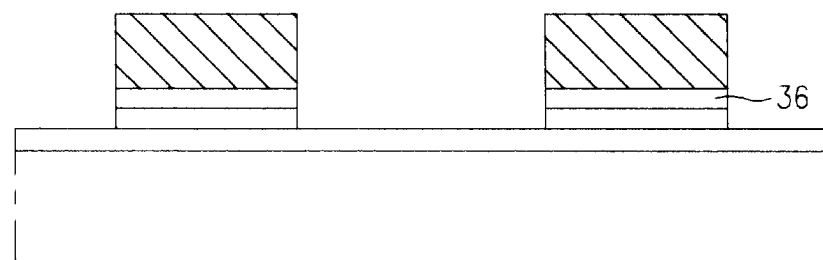
Figure 3C:
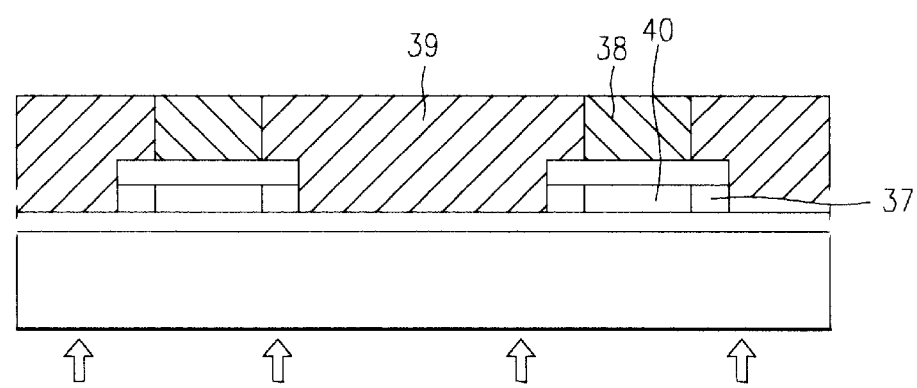
Figure 3D:
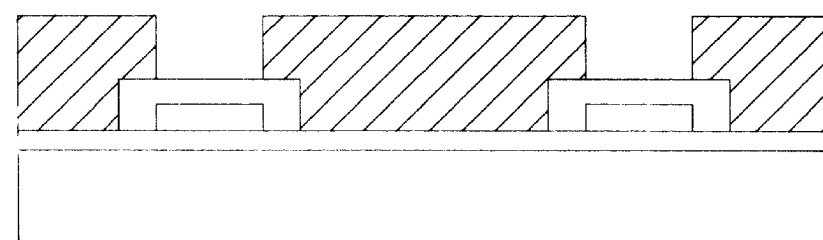
Figure 3E:
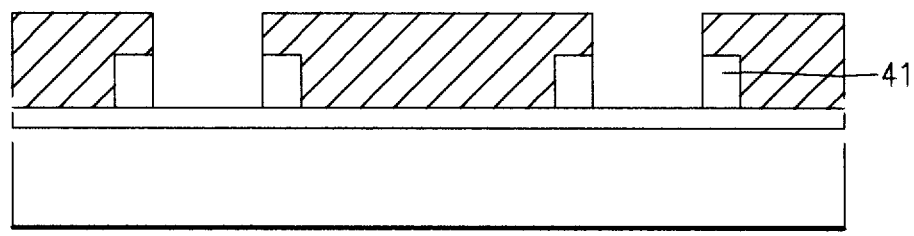
Figure 3F:
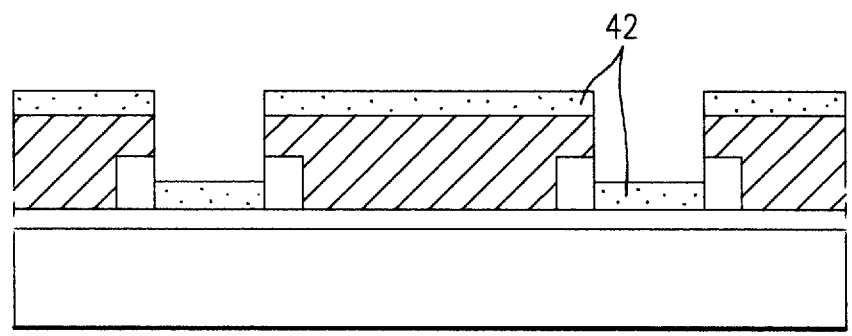
Figure 3G:
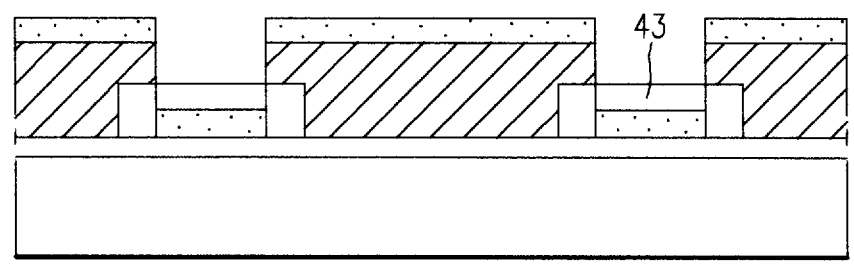
Figure 3H:
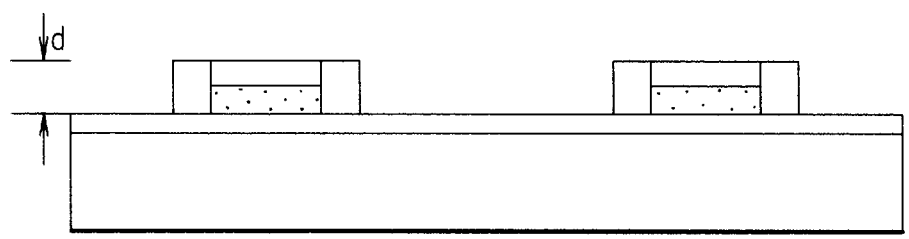

FIGS. 3a and 3h show sectional views of the process steps to form a phase shifting mask according to the present invention. As shown in FIG. 3a, an etching protective layer 32, a polysilicon layer 33, and a first oxide layer 34, acting as a first light-transmitting layer, are sequentially deposited on a transparent substrate 31. In a preferred embodiment, the etching protective layer 32 is formed of $SnO_2$, and the first oxide layer 34 is formed of $SiO_2$.

Subsequently, on the first oxide layer 34, a positive photoresist is deposited and electron beams are selectively irradiated to form a positive photoresist pattern layer 35.

As shown in FIG. 3b, a phase shifting light-transmitting pattern layer 36 is formed by selectively removing the exposed first oxide layer 34 using the positive photoresist pattern layer 35 as a mask and the polysilicon layer 33 as an etchant block layer (i.e., a layer that the etchant cannot etch away) Then, the exposed polysilicon layer 33 is removed using the positive photoresist pattern 35 and the light transmitting pattern layer as a mask and the etching protective layer 32 as an etchant block layer. Afterwards, the positive photoresist pattern 35 is removed.

As shown in FIG. 3c, side portions of the polysilicon layer 33 are oxidized in an ambient atmosphere of $O_2$ to form a non-oxized light-shielding pattern layer 40 and heat-oxidized phase-shifting light-transmitting pattern sidewalls 37 on either side of the light-shielding pattern layer 40. Then, a negative photoresist is deposited over the substrate 31.

As shown in FIG. 3d, the shielded portions 38 of the negative photoresist are removed by performing rear exposure using the light-shielding layer 40 as a mask. The non-shielded portions 39 of the negative photoresist remain.

Thereafter, the phase-shifting light-transmitting pattern layer 3G and the light-shielding pattern layer 40 are etched away using the non-shielded portions 39 of the negative photoresist as a mask, as shown in FIG. 3e, which leaves rim phase-shifting portions 41.

As shown in FIG. 3f, the non-shielded portions 39 of the negative photoresist and the exposed portions of the etching protective layer 32 are coated with Si, which contains 10% chrome using a sputtering process so that a half transparent layer 42 is formed.

A second oxide layer 43 is then formed using a liquid growth process at a temperature of 30° C., on the half transparent layer 42 formed between the non-shielded portions 39, as shown in FIG. 3g.

Finally, as shown in FIG. 3h, the non-shielded portions 39 of the negative photoresist and the half transparent layer 42 thereon are removed. The fabrication of the phase shifting mask having rim phase-shifting portions 41 at both sides of the half transparent layer 42 is, thus, complete. The transmission ratio of the half-tone layer formed by stacking the second oxide layer 43 on the half transparent layer 42 is preferably 5–30%. Also, as shown in FIG. 3h, the rim phase-shifting portions 41, formed by the phase-shifting light-transmitting layer 36 and the phase-shifting light-transmitting pattern sidewalls 37, have a thickness d equal to $\lambda/2(n-1)$; where $\lambda$ is a wavelength of an exposure source and n is the refraction index of the phase-shifting portions 41.

The other phase shifting mask according to the present invention will be described with reference to FIGS. 4a to 4f.

Figure 4A:
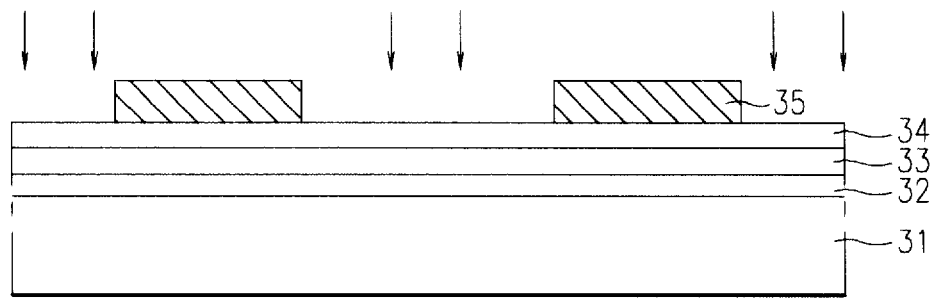
FIGS. 4a to 4f show sectional views of the process steps to form another phase shifting mask according to the present invention.

First, as shown in FIG. 4a, an etching protective layer 32, a polysilicon layer 33, and a first oxide layer 34, acting as a light-transmitting layer, are sequentially deposited on a transparent substrate 31. In a preferred embodiment, the etching protective layer 32 is formed of $SnO_2$, and the first oxide layer 34 is formed of $SiO_2$.

Subsequently, on the first oxide layer 34, a positive photoresist is deposited and electron beams are selectively irradiated to form a positive photoresist pattern layer 35.

Figure 4B:
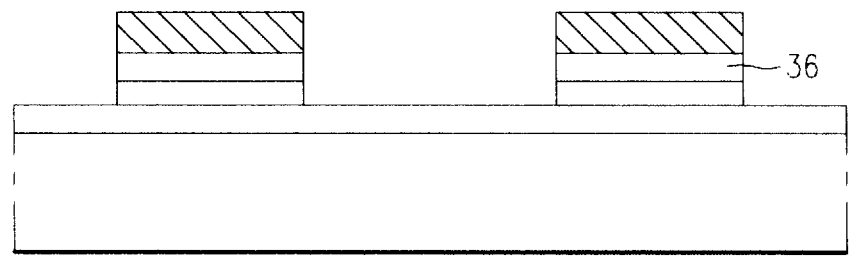

As shown in FIG. 4b, a phase-shifting light-transmitting pattern layer 36 is formed by selectively removing the exposed first oxide layer 35 using the positive photoresist pattern layer 35 as a mask and the polysilicon layer 33 as an etchant block layer. Then, the exposed polysilicon layer 33 is removed using the positive photoresist pattern 35 and the light transmitting pattern layer 36 as a mask and the etching protective layer 32 as an etchant block layer. Afterwards, the positive photoresist pattern 35 is removed.

Figure 4C:
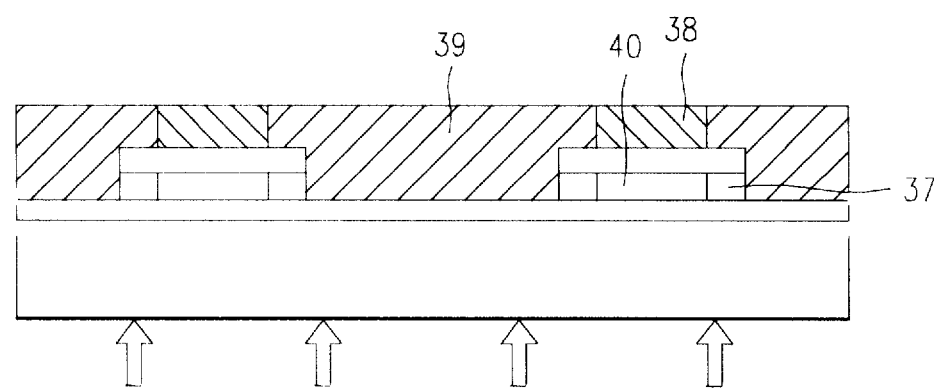

As shown in FIG. 4c, side portions of the polysilicon layer 33 are oxidized in an ambient atmosphere of $O_2$ to form a non-oxidized light-shielding pattern layer 40 and heat-oxidized phase-shifting light-transmitting pattern sidewalls 37 on either side of the light-shielding pattern layer 40. Then, negative photoresist is deposited over the substrate 31.

Figure 4D:
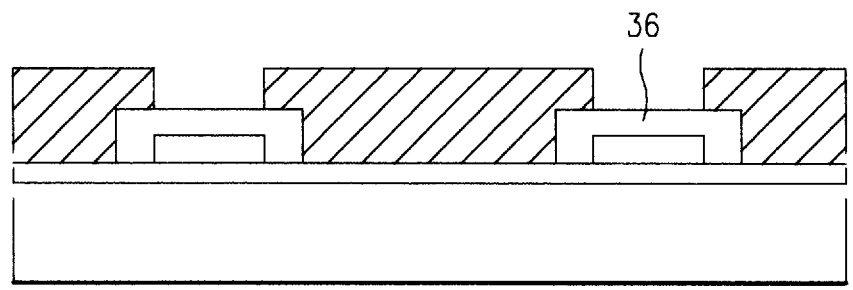

As shown in FIG. 4d, the shielded portions 38 of the negative photoresist are removed by performing rear exposure using the light-shielding pattern layer 40 as a mask. The non-shielded portions 39 of the negative photoresist remains.

Figure 4E:
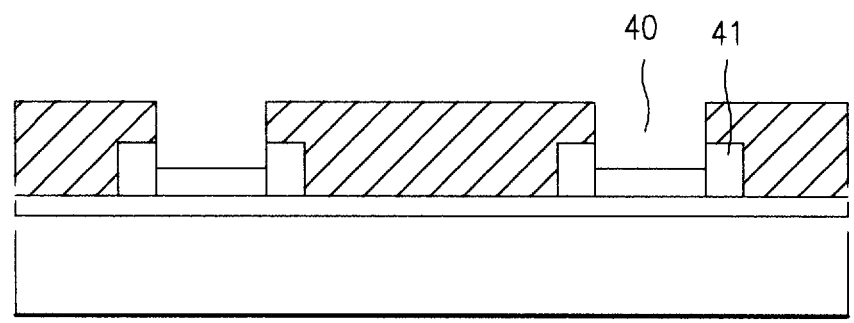

Thereafter, the portions of the phase-shifting light-transmitting pattern layer 36 exposed by removing the shielded portions 38 of the negative photoresist are etched away, as shown in FIG. 4e leaving the light-shielding pattern layer 40 with rim phase-shifting portions 41 adjacent thereto.

Figure 4F:
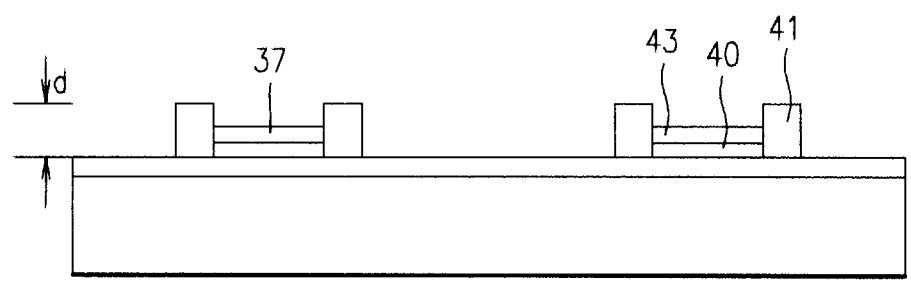

As shown in FIG. 4f, the light-shielding pattern layer 40 is heat-oxidized using the non-shielded portions 39 of the negative photoresist as a mask to form a second oxide layer 43 thereon.

Finally, the non-shielded portions 39 of the negative photoresist are removed. Thus, a half-tone layer, comprising the light-shielding pattern layer 40 and the second oxide layer 43, is formed. Also rim phase-shifting portions 41, comprising unetched portions of the phase-shifting light-transmitting pattern layer 40 and the phase-shifting light-transmitting sidewalls 37, are formed at both sides of the half-tone layer. Thus, the fabrication of the phase shifting mask having the half-tone layer and the rim phase-shifting portions is complete.

The transmission ratio of the half-tone layer, formed by the second oxide layer 43 stacked on the light-shielding pattern layer 40, is preferably 5–30%. Also, as shown in FIG. 4f, the rim phase-shifting portions 41 have a thickness d equal to $\lambda/2(n-1)$; where $\lambda$ is a wavelength of an exposure source and n is the refractive index of the rim phase-shifting portions 41.

The phase shifting mask according to the present invention as aforementioned has the following advantages. First, precise process steps according to self-alignment of the rim phase-shifting portions at both sides of the half-tone layer prevent defects due to the etching process from occurring. Thus, a uniform phase shifting mask can be fabricated. Second, since upper portions of the rim phase-shifting portions are formed in advance, it is easy to adjust the edges of the rim phase-shifting portions. As a result, edge effects can be enhanced.

Third, since the phase-shifting layer is formed along with the half-tone layer, an additional wet etching process as in prior art techniques is not needed. Therefore, the undercut phenomenon does not occur when the half-tone layer is formed, thereby improving the reliability of the device. Finally, since the half-tone layer can be formed by partial oxidation of polysilicon, the process steps are simplified.

It will be apparent to those skilled in the art that various modifications and variations can be made in the method for fabricating a phase shifting mask of the present invention without departing form the spirit or scope of the invention. Thus, it is intended that the present invention cover the modifications and variations of the invention provided they come within the scope of the appended claims and their equivalents.

What is claimed is:

1. A method for fabricating a phase-shifting mask, comprising:

providing a substrate having a light shielding layer and a phase-shifting light transmitting layer sequentially formed thereon;

first patterning said light shielding layer and said phase-shifting light-transmitting layer to form phase-shifting regions;

oxidizing sidewall portions of said light shielding layer in each phase-shifting region to form phase-shifting light-transmitting sidewall portions;

depositing photoresist over said substrate;

second patterning said photoresist using said light shielding layer as a mask such that in each phase-shifting region a portion of said phase-shifting light-transmitting layer on said light shielding layer is exposed by removal of said photoresist;

forming a rim phase-shifting layer in each phase-shifting region using said photoresist pattern as a mask, said rim phase-shifting layer including unexposed portions of said light shielding layer and said phase-shifting light transmitting sidewall portions; and forming a half-tone layer in each phase-shifting region using said photoresist pattern as a mask such that a rim phase-shifting layer is adjacent each side of said half-tone layer.

2. The method of claim 1, wherein said providing step provides said substrate with an etching protective layer, said light shielding layer, and said phase-shifting light-transmitting layer sequentially formed thereon.

3. The method of claim 2, wherein said etching protective layer is $SnO_2$.

4. The method of claim 2, wherein said first patterning step etches said light shielding layer and said phase-shifting light-transmitting layer to form said phase-shifting regions.

5. The method of claim 2, wherein said forming a rim phase-shifting layer step etches said exposed portions of said phase-shifting light transmitting layer and said light shielding layer thereunder.

6. The method of claim 1, wherein said phase-shifting light-transmitting layer is $SiO_2$.

7. The method of claim 1, wherein said light shielding layer includes a heat-oxidizing material.

8. The method of claim 1, wherein said light shielding layer includes Si.

9. The method of claim 1, wherein said light shielding layer is polysilicon.

10. The method of claim 1, wherein said second patterning step is performed by exposing said photoresist through said substrate using said light shielding layer as a mask.

11. The method of claim 1, wherein said forming a rim phase-shifting layer step etches said exposed portions of said phase-shifting light transmitting layer and said light shielding layer thereunder to form said rim phase-shifting layer on either side of an aperture.

12. The method of claim 11, wherein said forming a half-tone layer step forms said half-tone layer in said aperture.

13. The method of claim 11, wherein said forming a half-tone layer step comprises the steps of:
   forming a half transparent layer in said aperture; and
   forming an oxide layer in said aperture on said half transparent layer.

14. The method of claim 1, wherein said forming a rim phase-shifting layer step etches said exposed portions of said phase-shifting light transmitting layer to form said rim phase-shifting layer on either side of an aperture.

15. The method of claim 14, wherein said forming a half-tone layer step forms said half-tone layer in said aperture.

16. The method of claim 15, wherein said forming a half-tone layer step comprises the step of:
   forming an oxide layer in said aperture on said light-shielding layer.

17. The method of claim 1, wherein said forming a half-tone layer step comprises the steps of:
   forming a half transparent layer; and
   forming, by liquid growth, an oxide layer on said half transparent layer.

18. The method of claim 1, wherein said forming a half-tone layer step comprises the step of:
   heat oxidizing said light shielding layer.

19. The method of claim 1, wherein said forming a half-tone layer step forms said half-tone layer with a transmission ratio of 5–30%.

20. The method of claim 1, wherein said forming a rim phase-shifting layer step forms said rim phase-shifting layer to a thickness equal to $\lambda/2(n-1)$, where $\lambda$ is a wavelength of an exposure source and n is a refractive index of said rim phase-shifting layer.

21. A phase-shifting mask, comprising:
   a substrate;
   a plurality of half-tone layer portions formed on said substrate, each half-tone layer portion having sidewalls; and
   a rim phase-shifting portion formed on said substrate surrounding each half-tone layer portion and in contact with said sidewalls thereof.

22. The phase-shifting mask of claim 21, wherein said half-tone layer portions each include a half transparent layer portion formed on said substrate and an oxide layer portion formed on said half transparent layer portion.

23. The phase-shifting mask of claim 21, wherein said half-tone layer portions each include a light shielding layer portion formed on said substrate and an oxide layer portion formed on said half transparent layer portion.

24. The phases-shifting mask of claim 21, wherein said half-tone layer portions have a transmission ratio of 5–30%.

25. The phase-shifting mask of claim 21, wherein each said rim phase-shifting portion has a thickness equal to $\lambda/2(n-1)$, where $\lambda$ is a wavelength of an exposure source and n is a refractive index of said rim phase-shifting layer portions.

26. A method for fabricating a phase shift mask, comprising:
   providing a substrate having a light shielding layer and a phase-shifting light transmitting layer sequentially formed thereon;
   patterning the light shielding layer and the phase-shifting light transmitting layer to form phase-shifting regions; and
   oxidizing sidewall portions of the light shielding layer in each phase-shifting region to form phase-shifting light transmitting sidewall portions.

* * * * *